(12) United States Patent
Zhen (10) Patent No.: US 6,936,876 B2
(45) Date of Patent: Aug. 30, 2005

(54) SEMICONDUCTOR DEVICE HAVING FERROELECTRIC THIN FILM AND FABRICATING METHOD THEREFOR

(75) Inventor: Wendong Zhen, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/842,631

(22) Filed: Apr. 27, 2001

(65) Prior Publication Data

US 2001/0046717 A1 Nov. 29, 2001

(30) Foreign Application Priority Data

| Apr. 28, 2000 | (JP) | 2000-129690 |
| Sep. 19, 2000 | (JP) | 2000-283481 |
| Feb. 5, 2001 | (JP) | 2001-028606 |

(51) Int. Cl.$^7$ ................................................ H01G 4/30
(52) U.S. Cl. ...................... 257/295; 438/240; 438/381; 438/3; 257/310; 365/145; 365/149
(58) Field of Search .......................... 438/3, 240, 381, 438/387, 393, 396, 763; 257/295, 310, 414, 421; 365/145, 149

(56) References Cited

U.S. PATENT DOCUMENTS

| 5,635,420 | A | * | 6/1997 | Nishioka ........................ 438/3 |
| 5,736,759 | A | * | 4/1998 | Haushalter .................. 257/295 |
| 5,817,170 | A | | 10/1998 | Desu et al. |
| 5,970,337 | A | * | 10/1999 | Nishioka .................... 438/240 |
| 5,998,819 | A | * | 12/1999 | Yokoyama et al. ......... 257/295 |
| 6,033,920 | A | * | 3/2000 | Shimada et al. ............... 438/3 |
| 6,143,597 | A | * | 11/2000 | Matsuda et al. ............ 438/240 |
| 6,151,240 | A | * | 11/2000 | Suzuki ........................ 365/145 |
| 6,153,898 | A | | 11/2000 | Watanabe et al. |
| 6,338,970 | B1 | * | 1/2002 | Suh ................................ 438/3 |
| 2004/0056290 | A1 | * | 3/2004 | Kanaya et al. .............. 257/295 |

FOREIGN PATENT DOCUMENTS

| EP | 0 114 228 A2 | 8/1984 |
| EP | 0 709 355 A1 | 5/1996 |
| EP | 0 797 244 A2 | 9/1997 |
| EP | 0 821 415 A2 | 1/1998 |
| EP | 10321809 | 12/1998 |
| EP | 11026706 | 1/1999 |
| JP | 06-140570 | 5/1994 |
| JP | 8-078636 | 3/1996 |
| JP | 08-279599 | 10/1996 |
| JP | 8-325019 | 12/1996 |
| JP | 08-340085 | 12/1996 |
| JP | 9-025124 | 1/1997 |
| JP | 09-036309 | 2/1997 |
| JP | 10-050960 | 2/1998 |
| JP | 10-321809 A | 12/1998 |
| JP | 2000-058770 | 2/2000 |
| JP | 2000-067648 | 3/2000 |
| KR | 1999-5439 A | 2/1999 |
| WO | WO 96/05334 | 2/1996 |

OTHER PUBLICATIONS

Jia et al., "Low leakage current BaTiO$_3$ thin film capacitors using a multilayer construction," Elsevier Science, S.A., Thin Solid Films, vol. 259, No. 2 (1995), pp. 264–269.

* cited by examiner

*Primary Examiner*—Tom Thomas
*Assistant Examiner*—José R. Diaz
(74) *Attorney, Agent, or Firm*—Nixon & Vanderhye PC (57) ABSTRACT

A ferroelectric capacitor in a semiconductor device is constructed of a Pt lower electrode, a ferroelectric thin film and a Pt upper electrode that are successively laminated onto a silicon substrate. The ferroelectric thin film is constructed of a plurality of SBT layers. Crystal grains of the SBT layer are formed smaller than the crystal grains of the SBT layers. The SBT layer having small size grains improves the electrical characteristics and the ferroelectric characteristics of the ferroelectric capacitor.

6 Claims, 7 Drawing Sheets

SEMICONDUCTOR DEVICE HAVING FERROELECTRIC THIN FILM AND FABRICATING METHOD THEREFOR

BACKGROUND OF THE INVENTION

The present invention relates to a semiconductor device having a ferroelectric thin film to be used for, for example, an FERAM (ferroelectric random access memory) and a fabricating method therefor.

In recent years, there have energetically been conducted researches into a ferroelectric thin film for use in a semiconductor device. The semiconductor device having the ferroelectric thin film has energetically been examined and developed for the practical use thereof as a non-volatile memory capable of substituting for an EPROM (erasable programmable read only memory), an EEPROM (electrically erasable programmable read only memory) or a flash memory and as a memory capable of substituting for an SRAM (static random access memory) and a DRAM (dynamic random access memory) in terms of its high-speed write, read, low-voltage drive, satisfactory fatigue characteristic and so on.

The capacitor size is reduced by utilizing the high permittivity characteristic of the ferroelectric thin film, by which a gigabit-class device is fabricated by way of trial for the high-density integration of semiconductor devices such as DRAM's.

As described above, in order to apply the semiconductor device having the ferroelectric thin film to a variety of devices such as semiconductor devices, it is indispensable to develop a thin film forming technique of a ferroelectric material matched with the conventional semiconductor fabricating process. That is, the desired characteristics can be provided with a reduced film thickness by a reduction in the film forming temperature and the achievement of fine and flat configuration of the thin film, and it is demanded to develop a ferroelectric material capable of coping with micromachining and a reduction in an operating voltage as well as a thin film forming technique therefor.

Conventionally, there has been a semiconductor device having a ferroelectric capacitor constructed of a lower electrode, a ferroelectric thin film and an upper electrode, which are successively laminated onto a substrate. As a material for the ferroelectric thin film of this ferroelectric capacitor, there have been examined PZT ($PbZr_xTi_{1-x}O_3$) and SBT ($SrBi_2Ta_2O_9$). The SBT has the advantage that the deterioration thereof due to film fatigue is less than that of PZT and the advantage that it permits low-voltage driving.

As a method for forming a film of SBT, it is general to use the MOD (metal organic decomposition) method, the sol-gel method, the MOCVD (metal organic chemical vapor deposition) method, the sputtering method or a similar method. According to the above-mentioned methods, the ferroelectric thin film is required to be subjected to heat treatment at a temperature of 600° C. to 800° C. in an oxidizing atmosphere is necessary for bringing out the ferroelectric characteristic.

A method for fabricating a semiconductor device having a ferroelectric thin film made of an SBT material will be described below.

Figure 3A:
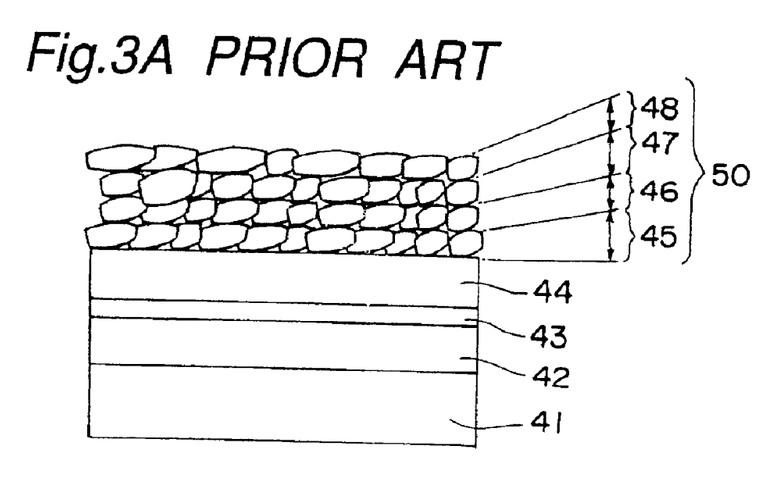
FIGS. 3A and 3B are process charts of a method for fabricating a conventional semiconductor device.

First of all, as shown in FIG. 3A, a silicon oxide film 42 having a film thickness of 200 nm is formed by thermal oxidation on a surface of a silicon substrate 41, and thereafter, a Ti adhesion layer 43 having a film thickness of 30 nm and a Pt lower electrode 44 having a film thickness of 200 nm are successively formed by the sputtering method on the silicon oxide film 42. Then, an SBT solution of a composition ratio of Sr/Bi/Ta=8/24/20 is applied onto the Pt lower electrode 44, subjected to a drying process at a temperature of 250° C. for five minutes and then to crystallization annealing at a temperature of 600° C. to 800° C. for 10 minutes to 60 minutes in an oxygen atmosphere, forming an SBT layer 45. Subsequently, by repeating a fabricating method similar to that of the SBT layer 45 three times, SBT layers 46, 47 and 48 are successively formed on the SBT layer 45, producing a ferroelectric thin film 50 that has a film thickness of 200 nm and is constructed of the plurality of SBT layers 45, 46, 47 and 48. The temperatures of crystallization annealing of the SBT layers 45, 46, 47 and 48 are the same.

Figure 3B:
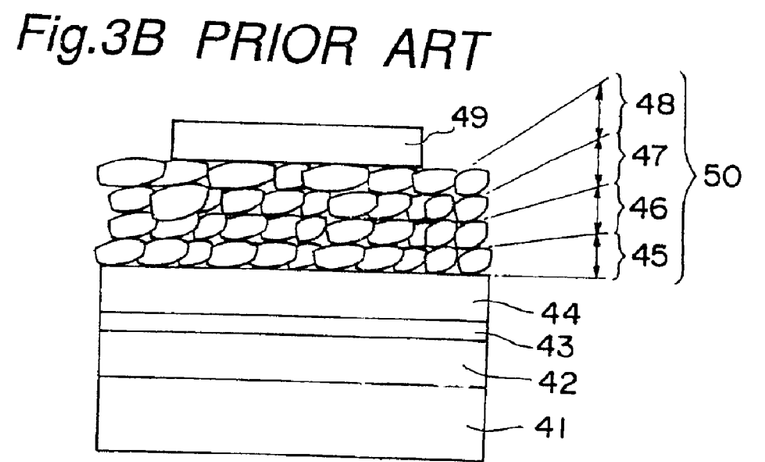

Finally, as shown in FIG. 3B, Pt laminated onto the dielectric thin film 50 is patterned by photolithography, forming a Pt upper electrode 49.

However, according to the above-mentioned semiconductor device fabricating method, when the crystallization annealing of the SBT layers 45, 46, 47 and 48 is performed at a temperature of 700° C. to 800° C., the ferroelectric characteristic is improved to increase the remanence. However, there is the problem that a gap of a pinhole or the like is increased and the symmetry of the hysteresis loop becomes worse, degrading the homogeneity of the ferroelectric capacitor.

On the other hand, uniform minute crystal grains can be obtained when crystallization annealing of the SBT layers 45, 46, 47 and 48 is performed at a temperature of 600° C. to 700° C. However, the remanence is small, and this means that the ferroelectric characteristic is not sufficiently brought out. Accordingly, there is the problem that the aforementioned ferroelectric capacitor cannot be used for a storage element.

According to the semiconductor device fabricating method of Japanese Patent Laid-Open Publication No. HEI 10-321809, crystallization annealing is performed at a temperature of 500° C. to 700° C. in a decompressed oxygen atmosphere of 10 Torr by means of a vacuum device. As a result, there is the problem that mass productivity is inferior to the case where the crystallization annealing is performed under the normal pressure because of the use of the vacuum device.

SUMMARY OF THE INVENTION

An object of the present invention is to provide a semiconductor device and fabricating method therefor capable of improving the homogeneity of a ferroelectric capacitor and being used for a storage element.

In order to achieve the aforementioned object, the present invention provides a method for fabricating a semiconductor device having a ferroelectric capacitor in which a lower electrode, a ferroelectric thin film constructed of at least three layers, and an upper electrode are successively laminated on a substrate, comprising the steps of: crystallizing an intermediate layer between a lowermost layer and an uppermost layer among the layers of the ferroelectric thin film by performing heat treatment for the intermediate layer at a first temperature for a first setting time; and crystallizing at least one of the lowermost layer and the uppermost layer by performing heat treatment at a second temperature lower than the first temperature.

According to the semiconductor device fabricating method of the present invention, the intermediate layer the ferroelectric thin film is crystallized by performing heat treatment at the first temperature for the first setting time, and at least one of the lowermost layer and the uppermost layer the ferroelectric thin film is crystallized by performing heat treatment at the second temperature lower than the first temperature.

As a result, the growth of coarse crystal grains is restrained in at least one of the lowermost layer and the uppermost layer of the ferroelectric thin film to increase the crystalline nucleus density and reduce gaps such as pin holes. Therefore, the surface morphology improves and the structure of the ferroelectric thin film becomes fine. This enhances the homogeneity of the ferroelectric capacitor.

Furthermore, the surface morphology of at least one of the lowermost layer and the uppermost layer of the ferroelectric thin film is improved. Therefore, adhesion of the ferroelectric thin film to the lower electrode or the upper electrode is enhanced to improve the electrical characteristics of the ferroelectric capacitor constructed of the lower electrode, the ferroelectric thin film and the upper electrode. Therefore, the ferroelectric capacitor can be used for a storage device.

Furthermore, crystallization of the ferroelectric thin film is performed with no vacuum device. Therefore, mass-productivity can be improved further than when the vacuum device is used.

In one embodiment of the present invention, both the lowermost layer and the uppermost layer are crystallized by performing heat treatment at the second temperature.

According to the above embodiment, both the lowermost layer and the uppermost layer of the ferroelectric thin film are crystallized by performing heat treatment at the second temperature which is lower than the first temperature. Therefore, growth of coarse crystal grains can be restrained in the lowermost layer and the uppermost layer. That is, the crystal grains of the lowermost layer and the uppermost layer of the ferroelectric thin film can uniformly be made minute.

In one embodiment of the present invention, a heat treatment time of the lowermost layer and the uppermost layer of the ferroelectric thin film is the first setting time.

According to the above embodiment, since the first setting time can be set to a long time, the lowermost layer and the uppermost layer of the ferroelectric thin film can be securely crystallized though the heat treatment for them is performed at the second temperature lower than the first temperature.

In one embodiment of the present invention, the lowermost layer is crystallized by performing heat treatment at the second temperature, and the uppermost layer is crystallized by performing heat treatment for a second setting time shorter than the first setting time at the first temperature.

According to the above embodiment, since the lowermost layer of the ferroelectric thin film is crystallized by performing heat treatment at the second temperature lower than the first temperature, the grain growth in the lowermost layer of the ferroelectric thin film can be restrained. Therefore, the crystal grains of the lowermost layer can uniformly be made more minute in comparison with the intermediate layer.

Also, the uppermost layer of the ferroelectric thin film is crystallized by performing heat treatment for the second setting time shorter than the first setting time at the first temperature, by which the growth of coarse crystal grains in the uppermost layer of the ferroelectric thin film can be restrained. Therefore, the crystal grains of the uppermost layer of the ferroelectric thin film can uniformly be made more minute in comparison with the intermediate layer.

In one embodiment of the present invention, a heat treatment time for crystallizing the lowermost layer is the first setting time, and a heat treatment temperature for crystallizing the uppermost layer is the first temperature in addition to the above heat treatment conditions. That is, the lowermost layer is crystallized by performing heat treatment at the second temperature for the first setting time, and the uppermost layer is crystallized by performing heat treatment at the first temperature for the second setting time shorter than the first setting time.

With this arrangement, the lowermost layer of the ferroelectric thin film can be securely crystallized though the second temperature for the lowermost layer is lower than the first temperature, and the uppermost layer of the ferroelectric thin film can be securely crystallized without coarse grain growth.

In one embodiment of the present invention, the lowermost layer is crystallized by performing heat treatment for the second setting time shorter than the first setting time, and the uppermost layer is crystallized by performing heat treatment at the second temperature.

Therefore, the crystal grains of the uppermost layer of the ferroelectric thin film can uniformly be made more minute in comparison with the intermediate layer.

In one embodiment of the present invention, a heat treatment temperature for crystallizing the lowermost layer is the first temperature, and a heat treatment time for crystallizing the uppermost layer is the first setting time in addition to the just above heat treatment conditions. That is, the lowermost layer is crystallized by performing heat treatment at the first temperature for the second setting time, and the uppermost layer is crystallized by performing heat treatment at the second temperature for the first setting time.

With this arrangement, the crystal grains of the uppermost layer of the ferroelectric thin film can uniformly be made more minute in comparison with the intermediate layer.

The present invention also provides a method for fabricating a semiconductor device having a ferroelectric capacitor in which a lower electrode, a ferroelectric thin film constructed of at least three layers, and an upper electrode are successively laminated on a substrate, comprising the steps of: crystallizing an intermediate layer between a lowermost layer and an uppermost layer among the layers of the ferroelectric thin film by performing heat treatment for the intermediate layer at a first temperature for a first setting time; and crystallizing at least one of the lowermost layer and the uppermost layer by performing heat treatment at the first temperature or a second temperature lower than the first temperature for a second setting time shorter than the first setting time.

According to the above-mentioned invention, at least one of the lowermost layer and the uppermost layer can uniformly be made more minute in comparison with the intermediate layer. Thereby, the crystalline nucleus density is increased and gaps such as a pinhole are reduced so that the surface morphology is improved. This allows homogeneity of the ferroelectric capacitor to be improved, so that adhesion of the ferroelectric thin film to the lower electrode and/or the upper electrode is improved. Accordingly, electrical characteristics and the ferroelectric characteristics of the ferroelectric capacitor are improved, so that the ferroelectric capacitor can be used for a storage device.

In one embodiment of the present invention, both the lowermost layer and the uppermost layer are crystallized by performing heat treatment for the second setting time.

According to the above embodiment, growth of coarse crystal grains in both the lowermost layer and the uppermost layer of the ferroelectric thin film can be restrained.

In one embodiment of the present invention, both the lowermost layer and the uppermost layer are crystallized by performing heat treatment for the second setting time, and a heat treatment temperature of the lowermost layer and the uppermost layer is the first temperature.

In one embodiment of the present invention, the first temperature is a temperature being higher than 700° C. and not higher than 800° C.

In one embodiment of the present invention, the second temperature is within a range of 600° C. to 700° C.

In one embodiment of the present invention, the first setting time is longer than 10 minutes and not longer than 60 minutes.

In one embodiment of the present invention, the second setting time is within a range of five minutes to 10 minutes.

In one embodiment of the present invention, the ferroelectric thin film is a ferroelectric substance of a Bi layer structure.

According to this above embodiment of the present invention, a fine crystal structure of the ferroelectric thin film can be obtained by using the above method, though the ferroelectric thin film is constructed of the Bi layer structure ferroelectric substance that tends to generate coarse crystal grains.

In one embodiment of the present invention, the ferroelectric thin film is formed by coating.

According to the above embodiment, the ferroelectric thin film has a uniform film thickness and can more simply be formed than that by the CVD method.

In one embodiment of the present invention, a film forming method of the ferroelectric thin film is an LSMCD method.

According to the above embodiment, the grain size of the ferroelectric thin film becomes more minute, and this allows a finer ferroelectric thin film to be formed.

In one embodiment of the present invention, the intermediate layer is crystallized by repeating processes for performing deposition and tentative baking at a third temperature a plurality of times and performing heat treatment at the first temperature for the first setting time.

According to the above embodiment of the present invention, a large crystal is grown when performing crystallization annealing at the first temperature for the first setting time. As a result, the remanence becomes great, and the ferroelectric characteristics can be fully brought out.

The present invention also provides a semiconductor device having a ferroelectric capacitor comprising: a lower electrode laminated on a substrate; a ferroelectric thin film laminated on the lower electrode, constructed of at least three layers including a lowermost layer, a uppermost layer and an intermediate layer located between the lowermost layer and the uppermost layer; and an upper electrode laminated on the ferroelectric thin film, wherein a crystal grain of at least one of the lowermost layer and the uppermost layer is smaller than a crystal grain of the intermediate layer.

According to the semiconductor device of the above-mentioned construction, the crystal grain of at least one of the lowermost layer and the uppermost layer of the ferroelectric thin film is smaller than the crystal grain of the intermediate layer located between the lowermost layer and the uppermost layer. With this arrangement, at least one of the lowermost layer and the uppermost layer of the ferroelectric thin film has a high crystalline nucleus density and satisfactory surface morphology. As a result, adhesion of the ferroelectric thin film to the lower electrode and/or the upper electrode is improved, and the electric characteristics of the ferroelectric capacitor are improved, so that the ferroelectric capacitor can be used for a storage device.

In one embodiment of the present invention, a crystal grain of the lowermost layer and a crystal grain of the uppermost layer is smaller than a crystal grain of the intermediate layer.

According to the embodiment, the lowermost layer and the uppermost layer of the ferroelectric thin film have a higher crystalline nucleus density and satisfactory surface morphology in comparison with the intermediate layer.

The present invention also provides a method for fabricating a semiconductor device having a ferroelectric capacitor in which a lower electrode, a ferroelectric thin film constructed of at least three layers, and an upper electrode are successively laminated on a substrate, comprising the step of: crystallizing the lowermost layer of the ferroelectric thin film by laser annealing.

According to the semiconductor device fabricating method, generation of the crystalline nucleus precedes crystal growth by laser annealing to increase the crystalline nucleus density in the lowermost layer of the ferroelectric thin film and thus to restrain growth of coarse crystal grains. Accordingly, the gap of the pinhole or the like is reduced, and the surface morphology is improved in the lowermost layer. As a result, the crystal grains of the ferroelectric thin film become minute, and the uniformity in crystal grain size can be improved. Therefore, the structure of the ferroelectric thin film becomes fine, and the electric characteristic and ferroelectric characteristic of the ferroelectric capacitor can be improved.

The present invention further provides a method for fabricating a semiconductor device having a ferroelectric capacitor in which a lower electrode, a ferroelectric thin film constructed of at least three layers, and an upper electrode are successively laminated on a substrate, comprising the step of: crystallizing the lowermost layer of the ferroelectric thin film by rapid thermal annealing with infrared ray heating.

According to the semiconductor device fabricating method, generation of the crystalline nucleus precedes crystal growth by rapid thermal annealing to increase the crystalline nucleus density in the lowermost layer of the ferroelectric thin film and thus to restrain growth of coarse crystal grains.

In one embodiment of the present invention, the ferroelectric thin film is made of a material expressed by $Bi_2A_{m-1}B_mO_{3m+3}$ where A represents one selected from a group consisting of Na, K, Pb, Ca, Sr, Ba and Bi; B represents one selected from a group consisting of Fe, Ti, Nb, Ta, W and Mo; and m represents a natural number.

According to the above embodiment, deterioration due to the film fatigue in the ferroelectric thin film can be reduced.

In one embodiment of the present invention, a semiconductor device having a ferroelectric capacitor comprising: a lower electrode laminated on a substrate; a ferroelectric thin film laminated on the lower electrode, constructed of at least three layers including a lowermost layer, a uppermost layer and an intermediate layer located between the lowermost layer and the uppermost layer; and an upper electrode laminated on the ferroelectric thin film, wherein a crystalline nucleus density of the lowermost layer is higher than those of other layers than the lowermost layer.

According to the semiconductor device of the above-mentioned construction, growth of coarse crystal grains in the lowermost layer is restrained. Therefore, the crystal grains in the lowermost layer become minute to uniform the crystal grain size. As a result, homogeneity of the ferroelectric capacitor is improved, and the symmetry of the hysteresis loop is improved, allowing the remanence to be increased.

The improved surface morphology of the ferroelectric thin film leads to adhesion of the ferroelectric thin film to the lower electrode and the upper electrode is improved to reduce cracks, by which a leak current generated between the lower electrode and the upper electrode can be reduced.

The remanence of the ferroelectric capacitor is great, and the leak current in the ferroelectric capacitor is reduced. Therefore, when the ferroelectric capacitor is used for a storage device, the performance of the storage device can be improved.

The cracks generated in the ferroelectric capacitor are reduced, and therefore, the manufacturing yield can be increased.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAIDED DESCRIPTION OF THE PREFERRED EMBODIMENTS

The semiconductor device and fabricating method of the present invention will be described in detail below with reference to the accompanying drawings.

Figure 1A:
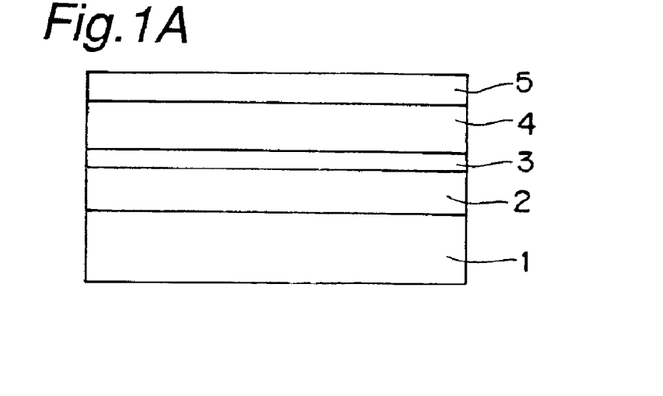
FIGS. 1A through 1C are process charts of a method for fabricating a semiconductor device according to a first embodiment of the present invention.
Figure 1B:
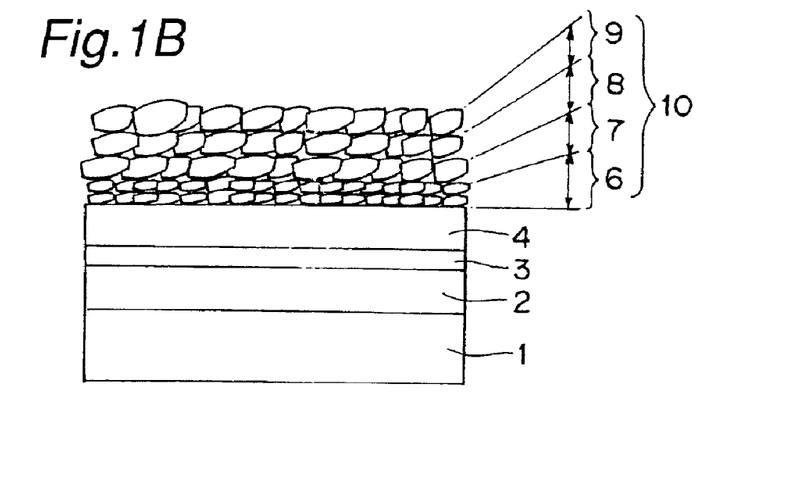
Figure 1C:
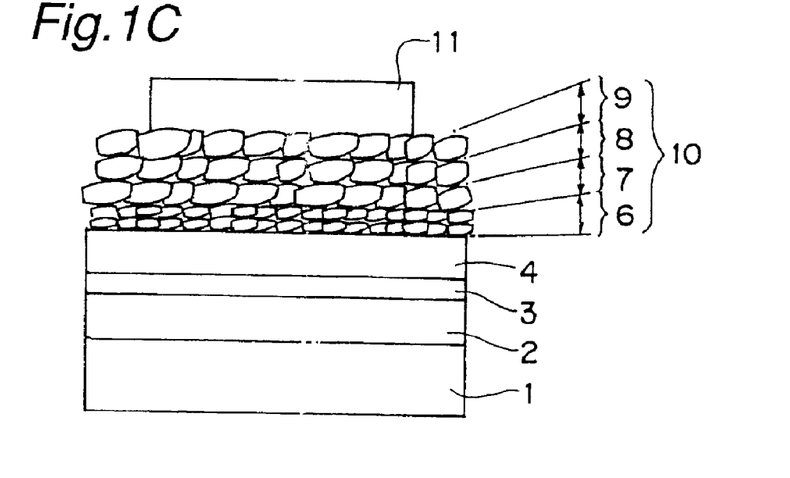

FIGS. 1A through 1C are process charts showing a fabricating method for a semiconductor device according to a first embodiment of the present invention.

Firstly, as shown in FIG. 1A, a silicon oxide film 2 is formed on a surface of a silicon substrate 1 by thermal oxidation. Thereafter, a Ti adhesion layer 3 and a Pt lower electrode 4 are successively formed on the silicon oxide film 2 by the sputtering method. Then, an SBT solution 5 of a composition ratio of e.g. Sr/Bi/Ta=8/24/20 is applied onto the Pt lower electrode 4 to a thickness of e.g. 50 nm. Thereafter, the silicon substrate 1 with the layers 2 to 5 are subjected to a drying process performed at a temperature of 250° C. for five minutes.

Next, as shown in FIG. 1B, an SBT layer 6 is formed by performing annealing in an oxygen atmosphere at a temperature between 600° C. and 700° C. as a second temperature for a time of e.g. 30 minutes as a first setting time. The SBT layer 6 serves as a lowermost layer having uniform minute crystal grains. Further, an SBT solution is applied onto the SBT layer 6 to a thickness of e.g. 50 nm and then dried. Thereafter, an SBT layer 7 is by performing annealing in an oxygen atmosphere at a temperature of e.g. 800° C. as a first temperature for 30 minutes. An SBT layer 8 and an SBT layer 9 are successively laminated onto the SBT layer 7 by performing two times the same process as that used in forming the insulating layer 7. As a result, there is formed a ferroelectric thin film 10 constructed of the SBT layers 6, 7, 8 and 9 and having a thickness of 200 nm.

As shown in FIG. 1C, Pt is laminated onto the ferroelectric thin film 10 by the sputtering method. Thereafter, the laminated Pt is patterned by photolithography to form a Pt upper electrode 9 having a desired pattern. A ferroelectric capacitor is finally formed, which is constructed of the Pt lower electrode 4, the ferroelectric thin film 10 and the Pt upper electrode 11.

As described above, the annealing temperature for forming the SBT layer 6 is lower than the annealing temperature for forming the SBT layers 7, 8, 9 and restrains grains of the SBT layer 6 from growing coarsely. Therefore, a crystalline nucleus density of the SBT layer 6 becomes high, and a gap such as a pinhole decreases in size to improve the surface morphology. Consequently, a structure of the ferroelectric thin film 10 becomes fine, which allows the homogeneity of the ferroelectric capacitor to be further improved.

Since the surface morphology of the SBT layer 6 is improved, adhesion of the ferroelectric thin film 10 to the Pt lower electrode 4 is improved, and therefore electrical characteristics of the ferroelectric capacitor are improved. As a result, the ferroelectric capacitor can be used for a storage device.

Crystallization of the ferroelectric thin film 10 is performed without using any vacuum device. Since the vacuum device is not needed, mass-productivity can be improved further than when the vacuum device is used.

Even though the ferroelectric thin film 10 is a Bi layer structure ferroelectric substance that tends to generate coarse crystal grains, it is possible to make the crystal structure of the ferroelectric thin film 10 fine.

As described above, the ferroelectric thin film 10 is formed by coating. Therefore, the ferroelectric thin film 10 having a uniform film thickness can be formed more simply than that formed by the CVD method.

The table 1 shows electron beam intensities i.e. count numbers of a plurality of ferroelectric thin films formed under different conditions for film forming. As the electron beam intensity becomes greater, crystallinity becomes better and remanence becomes greater in the ferroelectric thin film 10. The electron beam intensities are measured on a 105 plane that is one crystal plane by the x-ray diffraction method.

TABLE 1

| | LAYERS | I | II |
|---|---|---|---|
| (1) | all layers | 800° C. for 30 minutes: | 600 |
| (2) | all layers | 650° C. for 30 minutes: | 450 |
| (3) | lowermost layer other layers | 700° C. for 30 minutes, 800° C. for 30 minutes: | 1100 |

TABLE 1-continued

| | LAYERS | I | II |
|---|---|---|---|
| (4) | lowermost layer other layers | 650° C. for 30 minutes, 800° C. for 30 minutes: | 1200 |
| (5) | uppermost layer other layers | 700° C. for 30 minutes, 800° C. for 30 minutes: | 810 |
| (6) | uppermost layer other layers | 600° C. for 30 minutes, 800° C. for 30 minutes: | 900 |

NOTE
I: Ferroelectric thin film Forming Condition
II: Electron Beam Intensity shown by counts per second On the condition (1), all the SBT layers constituting the ferroelectric thin film are formed by annealing at a temperature of 800° C. for 30 minutes. On the condition (2), all the SBT layers constituting the ferroelectric thin film are formed by annealing at a temperature of 650° C. for 30 minutes. On the condition (3), only the lowermost SBT layer of the SBT layers constituting the ferroelectric thin film is formed by annealing at a temperature of 700° C. for 30 minutes, while the other SBT layers are formed by annealing at a temperature of 800° C. for 30 minutes. On the condition (4), only the lowermost SBT layer is formed by annealing at a temperature of 650° C. for 30 minutes, while the other SBT layers are formed by annealing at a temperature of 800° C. for 30 minutes. On the condition (5), only the uppermost SBT layer of the SBT layers constituting the ferroelectric thin film is formed by annealing at a temperature of 700° C. for 30 minutes, while the other SBT layers are formed by annealing at a temperature of 800° C. for 30 minutes. On the condition (6), only the uppermost SBT layer is formed by annealing at a temperature of 600° C. for 30 minutes, while the other SBT layers are formed by annealing at a temperature of 800° C. for 30 minutes.

As shown in Table 1, the crystallinity is improved in the cases of (3), (4), (5) and (6) where only the lowermost layer or the uppermost layer of the SBT layers is formed by annealing at a relatively low temperature by comparison with the cases of (1) and (2) where all the SBT layers constituting the ferroelectric thin film are formed on the same conditions. The electron beam intensity has a greater value in the case where only the lowermost layer of the SBT layers is formed by annealing at a relatively low temperature than in the case where only the uppermost layer of the SBT layers is formed by annealing at a relatively low temperature. Therefore, the crystallinity is improved more in the case where only the lowermost layer of the SBT layers is formed by annealing at a relatively low temperature, and therefore, this case is more preferable.

Although the annealing time for forming the SBT layer 6 is 30 minutes in the first embodiment, the annealing time may be a time longer than 10 minutes and not longer than 60 minutes.

In the first embodiment, the SBT layer 6 is formed as the lowermost layer of the ferroelectric thin film 10 by performing annealing at a temperature of 600° C. to 700° C. for 30 minutes in the oxygen atmosphere. However, the lowermost layer of the SBT layers may be formed by performing annealing in the oxygen atmosphere at a temperature being higher than 700° C. and not higher than 800° C. for 5 to 10 minutes as a second setting time. Even in this case, an effect similar to that of the first embodiment can be produced.

In the first embodiment, silicon is used as a preferable material for the substrate for forming the ferroelectric capacitor. However, a material of the substrate is not specifically limited so long as it can be used for a substrate of a semiconductor device or an integrated circuit.

In the first embodiment, the SBT solution of the composition ratio of Sr/Bi/Ta=8/24/20 is used. However, an SBT solution other than the above composition ratio may be used.

FIGS. 2A through 2D are process charts of a semiconductor device fabricating method according to a second embodiment of the present invention.

Figures 2A, 2B:
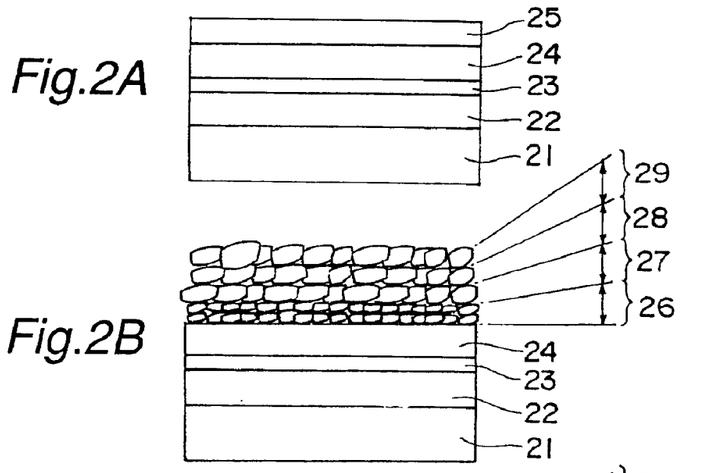
FIGS. 2A through 2D are process charts of a method for fabricating a semiconductor device according to a second embodiment of the present invention.

As shown in FIG. 2A, a silicon oxide film 22 is formed on a surface of a silicon substrate 21 by thermal oxidation, and thereafter, a Ti adhesion layer 23 and a Pt lower electrode 24 are successively formed on the silicon oxide film 22 by the sputtering method. Then, an SBT solution of a composition ratio of e.g. Sr/Bi/Ta=8/24/20 is applied onto the Pt lower electrode 24 to a thickness of e.g. 40 nm and thereafter subjected to a drying process performed at a temperature of 250° C. for five minutes.

Next, as shown in FIG. 2B, an SBT layer 26 is formed by performing annealing in an oxygen atmosphere at a temperature between 600° C. and 700° C. as a second temperature for 30 minutes as a first setting time. The SBT layer 26 serves as a lowermost layer having uniform minute crystal grains. Further, an SBT solution is applied onto the SBT layer 26 to a thickness of e.g. 40 nm and then dried. Thereafter, an SBT layer 27 is formed by performing annealing in an oxygen atmosphere at a temperature of e.g. 750° C. as a first temperature for 30 minutes. An SBT layer 28 and an SBT layer 29 are successively laminated onto the SBT layer 27 by performing two times a forming process similar to that of this SBT layer 27. The annealing temperature of the SBT layers 27, 28 and 29 is required to be a temperature being higher than 700° C. and not higher than 800° C. The annealing time of the SBT layers 27, 28 and 29 is required to be a time longer than 10 minutes and not longer than 60 minutes.

Figure 2C:
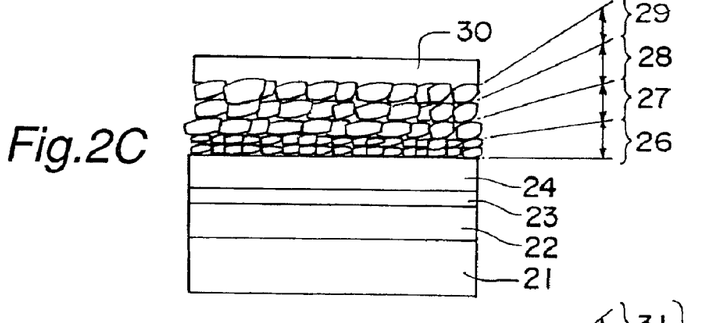

Next, as shown in FIG. 2C, an SBT solution 30 is applied onto the SBT layer 29.

Figure 2D:
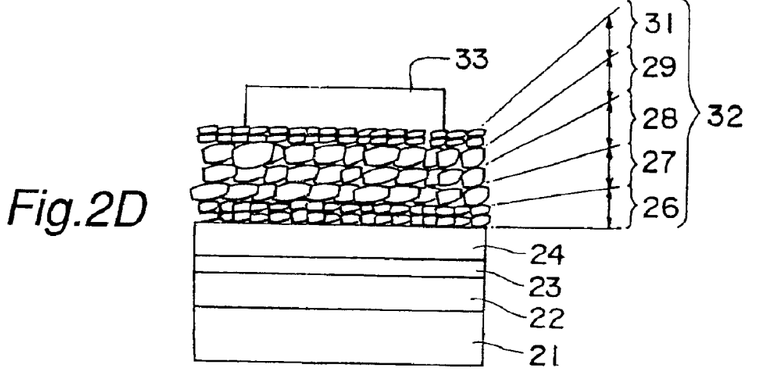

Then, the SBT solution 30 on the SBT layer 29 is subjected to annealing at a relatively low temperature of 600° C. to 700° C. for 30 minutes in the oxygen atmosphere. As shown in FIG. 2D, an SBT layer 31 having uniform minute crystal grains is formed by this annealing to form a ferroelectric thin film 32 having a film thickness of 200 nm constructed of SBT layers 26, 27, 28, 29 and 31. Pt is laminated onto the ferroelectric thin film 32 by the sputtering method. Thereafter, the laminated Pt is patterned by photolithography to form a Pt upper electrode 33 having the desired pattern. A ferroelectric capacitor is finally formed, which is constructed of the Pt lower electrode 24, the ferroelectric thin film 32 and the Pt upper electrode 33.

As described above, the annealing temperature for forming the SBT layers 26 and 31 is lower than the annealing temperature for forming the SBT layers 27, 28, 29 and restrains grains of the SBT layers 26 and 31 from growing coarsely. Therefore, crystalline nucleus densities of the SBT layer 26 and 31 become high, and gaps such as pinholes decrease in size to improve the surface morphology. Consequently, a structure of the ferroelectric thin film 32 becomes fine, which allows the homogeneity of the ferroelectric capacitor to be further improved.

Since the surface morphology of the SBT layers 26 and 31 is improved, the adhesion of the ferroelectric thin film 32 to the Pt lower electrode 24 and the Pt upper electrode 33 is improved, and therefore the electrical characteristics of the ferroelectric capacitor are improved. As a result, the ferroelectric capacitor can be used for a storage device. As a result, the ferroelectric capacitor can be used for a storage device.

Furthermore, crystallization of the ferroelectric thin film 32 is performed without using any vacuum device. Since the vacuum device is not needed, mass-productivity can be improved further than when the vacuum device is used.

Even though the ferroelectric thin film 32 is a Bi layer structure ferroelectric substance that tends to generate coarse crystal grains, it is possible to make the crystal structure of the ferroelectric thin film 32 fine.

The ferroelectric thin film 32 is formed by coating, the ferroelectric thin film 32 having a uniform film thickness can be formed more simply than that formed by the CVD method.

Although the annealing time for forming the SBT layers 26 and 31 is 30 minutes in the second embodiment, the annealing time is merely required to be longer than 10 minutes and not longer than 60 minutes.

In the second embodiment, the SBT layers 26 and 31 are formed by performing annealing at a temperature of 600° C. to 700° C. for 30 minutes. However, by performing annealing at a temperature of e.g. 750° C. for 10 minutes, it is acceptable to form the SBT layer that serves as the lowermost layer of the ferroelectric thin film and the SBT layer that serves as the uppermost layer of the ferroelectric thin film. Even in this case, an effect similar to that of the second embodiment is produced. In this case, the annealing time of the lowermost and uppermost SBT layers is merely required to be within a range of five minutes to 10 minutes. The annealing temperature of the lowermost and uppermost SBT layers is merely required to be higher than 700° C. and not higher than 800° C.

It is also acceptable to form the lowermost SBT layer of the ferroelectric thin film by performing annealing at a temperature of e.g. 750° C. for 5 to 10 minutes and to form the uppermost SBT layer by performing annealing at a temperature of 600° C. to 700° C. for 30 minutes. In this case, the annealing temperature of the lowermost SBT layer is required to be higher than 700° C. and not higher than 800° C. The annealing time of the uppermost SBT layer is required to be longer than 10 minutes and not longer than 60 minutes.

It is also acceptable to form the lowermost SBT layer of the ferroelectric thin film by performing annealing at a temperature of e.g. 600° C. to 700° C. for 30 minutes and to form the uppermost SBT layer by performing annealing at a temperature of e.g. 750° C. for 5 to 10 minutes. In this case, the annealing time of the lowermost SBT layer is required to be longer than 10 minutes and not longer than 60 minutes. The annealing temperature of the uppermost SBT layer is required to be higher than 700° C. and not higher than 800° C.

In the aforementioned second embodiment, silicon is used as a preferable material for the substrate for forming the ferroelectric capacitor. However, a material of the substrate is not specifically limited so long as it can be used for a substrate of a semiconductor device or an integrated circuit.

Although the SBT solution of the composition ratio of Sr/Bi/Ta=8/24/20 is used in the second embodiment, an SBT solution other than the above composition ratio may be used.

A semiconductor device fabricating method according to a third embodiment of the present invention will be described below.

Figure 4A:
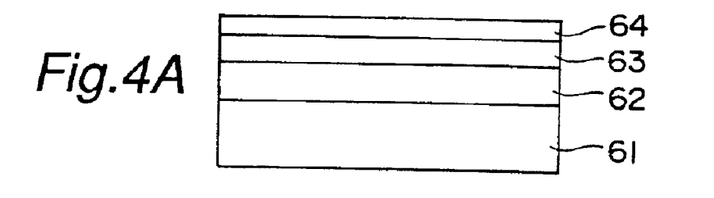
FIGS. 4A through 4D are process charts of a method for fabricating a semiconductor device according to second, third, fourth, fifth and sixth embodiments of the present invention.

As shown in FIG. 4A, a silicon oxide film 62 is firstly formed on a surface of a silicon substrate 61 by thermal oxidation. Thereafter, a lower electrode 63 is formed on the silicon oxide film 62. Then, an SBT solution 64 of a composition ratio of e.g. Sr/Bi/Ta=7/23/20 is deposited on the lower electrode 63 by the liquid source misted chemical deposition (LSMCD) method.

Figure 4B:
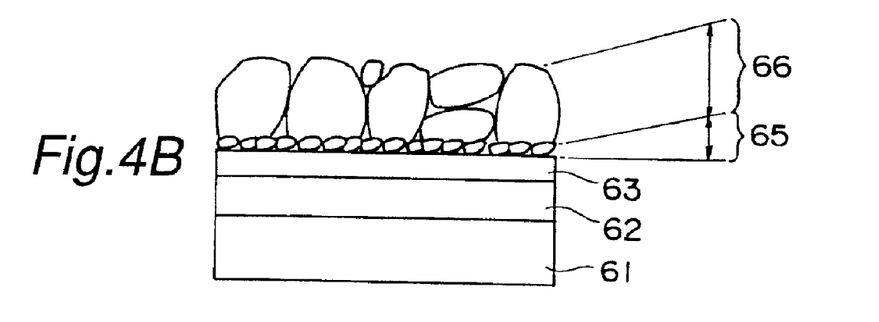

Next, as shown in FIG. 4B, the SBT solution 64 is subjected to drying and tentative baking. Thereafter, the SBT solution 64 is annealed in an oxygen atmosphere at a temperature of 600° C. to 700° C. as a second temperature for e.g. 30 minutes as a first setting time. An initial layer 65 is formed on the lower electrode 63 so as to serve as a lowermost layer having a grain size of good uniformity. Further, one layer of a solution ($Sr(OC_2H_4OC_2H_5)_2$, $Bi(O-nC_4H_9)_3$, $Ta(OC_2H_5)_5$) as a precursor of $Sr_{0.7}Bi_{2.3}Ta_2O_9$ is deposited by the LSMCD method, dried at a temperature of 150° C. for 30 minutes and thereafter tentatively baked at a temperature of 450° C. as a third temperature. The processes of depositing, drying and tentative baking are repeated for example three times. Thereafter, crystallization annealing is performed in an oxygen atmosphere at a temperature of 800° C. as a first temperature for 30 minutes, and thus an SBT thin film 66 is formed on the initial layer 65.

Figure 4C:
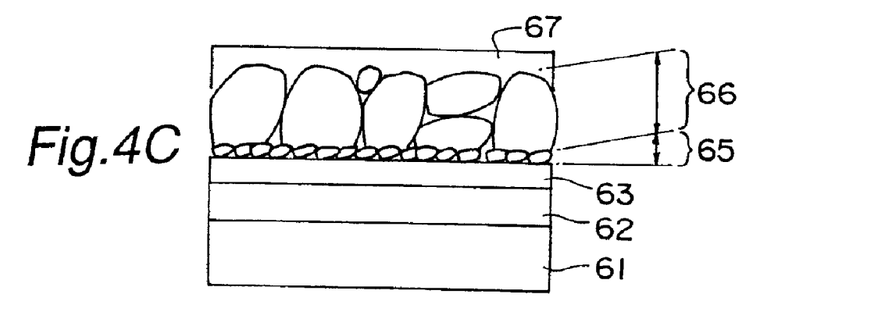

Next, as shown in FIG. 4C, one layer of an SBT solution 67 is formed on the SBT thin film 66 by the LSMCD method.

Figure 4D:
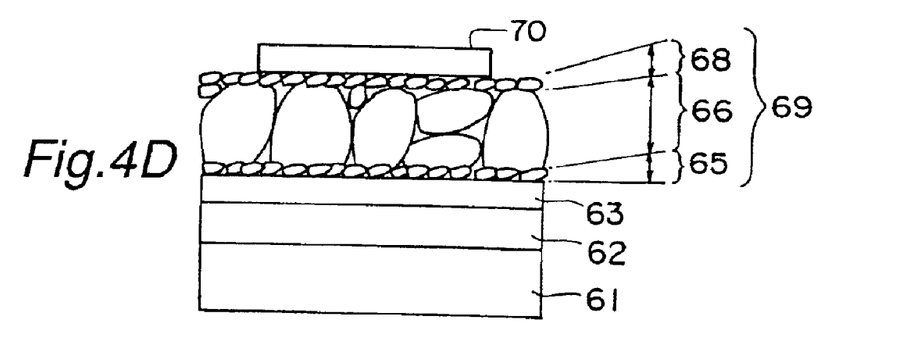

Next, as shown in FIG. 4D, the SBT solution 67 is subjected to drying and tentative baking and thereafter annealed in an oxygen atmosphere at a relatively low temperature of 600° C. to 700° C. for e.g. 30 minutes. A final layer 68 is formed on the SBT thin film 66 by this annealing to serve as the uppermost layer having a grain size of good uniformity. An SBT ferroelectric thin film 69, which is constructed of the initial layer 65, the SBT thin film 66 and the final layer 68, is formed. Then, Pt that serves as an upper electrode material is deposited on the SBT ferroelectric thin film 69 by the sputtering method. Thereafter, Pt is processed by using a register patterned by photolithography as a mask, so as to form an upper electrode 70.

As described above, annealing is performed at a relatively low temperature of 600° C. to 700° C. for 30 minutes to form the initial layer 65 and the final layer 68. Therefore, crystal grains in the initial layer 65 and the final layer 68 is restrained from growing coarsely. Therefore, crystalline nucleus densities of the SBT layers 65 and 68 become high, and a gap such as a pinhole decreases in size to improve the surface morphology. Consequently, the structure of the ferroelectric thin film 69 becomes fine, and this allows the homogeneity of the ferroelectric capacitor to be further improved.

Since the surface morphology of the initial layer 65 and the final layer 68 is improved, adhesion of the ferroelectric thin film 69 to the lower electrode 63 and the upper electrode 70 is improved, and the electrical characteristics of the ferroelectric capacitor 69 are further improved. The SBT thin film 66 is formed by performing crystallization annealing at a relatively high temperature of 800° C. for 30 minutes, and therefore, the remanence becomes great, allowing the ferroelectric characteristic to be fully brought out. As a result, the ferroelectric capacitor 69 can be used for a storage element.

Crystallization of the ferroelectric thin film 32 is performed without using any vacuum device. Since the vacuum device is not needed, mass-productivity can be improved further than when the vacuum device is used.

Even though the ferroelectric thin film 69 is a Bi layer structure ferroelectric substance that tends to generate coarse crystal grains, it is possible to make the crystal structure of the ferroelectric thin film 69 fine.

Since the ferroelectric thin film 69 is formed by the LSMCD method, the grain size of the uniform ferroelectric thin film 69 becomes finer, so that a finer ferroelectric thin film can be obtained.

The process of subjecting the SBT thin film 66 to depositing, drying and tentative baking at a temperature of 450° C. is repeated for example three times. Therefore, large crystals are grown when crystallization annealing is performed at a temperature of 800° C. for 30 minutes. As a result, the remanence is increased to allow a ferroelectric characteristic to be brought out fully and securely.

Although the annealing time for forming the initial layer 65, the SBT thin film 66 and the final layer 68 is 30 minutes in the third embodiment, the annealing time may be longer than 10 minutes and not longer than 60 minutes.

The annealing temperature for forming the initial layer 65 and the final layer 68 is 600° C. to 700° C. However, since the tentative baking at a temperature of 450° C. has been preliminarily performed, the annealing temperature may be 550° C. to 700° C.

Although the process of depositing, drying and tentative baking has been performed three times in order to form the SBT thin film 66, the process may be repeated two times or three or more times. In short, the process of performing drying and tentative baking may be repeated a plurality of times.

Although the temperature of crystallization annealing for crystallizing the SBT thin film 66 is 800° C., the temperature of crystallization annealing may be higher than 700° C. and not higher than 800° C.

A semiconductor device fabricating method according to a fourth embodiment of the present invention will be described below.

The semiconductor device fabricating method according to the fourth embodiment differs from the third embodiment only in processes of forming the initial layer 65 and the final layer 68. Therefore, the processes for forming the initial layer 65 and the final layer 68 will be described below with reference to FIGS. 4A through 4D. Since the other processes are similar to those of the third embodiment, no description is provided for them.

The initial layer 65 is formed as follows. The SBT solution 64 shown in FIG. 4A is dried and tentatively baked and thereafter annealed in an oxygen atmosphere at a relatively high temperature of 800° C. as the first temperature for 5 to 10 minutes as the second setting time. Through this operation, the initial layer 65 whose crystal grain size is well-uniformalized is formed on the lower electrode 63 as shown in FIG. 4B.

The final layer 68 is formed as follows. The SBT solution 67 shown in FIG. 4C is dried and tentatively baked and thereafter annealed in an oxygen atmosphere at a relatively high temperature of 800° C. for 5 to 10 minutes. Through this operation, the final layer 68 having a crystal grain size of good uniformity is formed on the SBT thin film 66 as shown in FIG. 4D.

Though the initial layer 65 and the final layer 68 are formed as described above, an effect similar to that of the third embodiment is produced.

Although the annealing temperature for forming the initial layer 65 and the final layer 68 is 800° C. in the fourth embodiment, the annealing temperature is merely required to be higher than 700° C. and not higher than 800° C.

A semiconductor device fabricating method according to a fifth embodiment of the present invention will be described below.

The semiconductor device fabricating method according to the fifth embodiment differs from the third embodiment only in processes of forming the initial layer 65 and the final layer 68. Therefore, the processes for forming the initial layer 65 and the final layer 68 will be described below with reference to FIGS. 4A through 4D. Since the other processes are similar to those of the third embodiment, no description is provided for them.

The initial layer 65 is formed as follows. The SBT solution 64 shown in FIG. 4A is dried and tentatively baked and thereafter annealed in an oxygen atmosphere at a relatively low temperature of 600° C. to 700° C. as the second temperature in an oxygen atmosphere for e.g. 30 minutes as the first setting time. Through this operation, the initial layer 65 whose crystal grain size is well-uniformalized is formed on the lower electrode 63 as shown in FIG. 4B.

The final layer 68 is formed as follows. The SBT solution 67 shown in FIG. 4C is dried and tentatively baked and thereafter annealed in an oxygen atmosphere at a relatively high temperature of 800° C. for 5 to 10 minutes. Through this operation, the final layer 68 whose crystal grain size is well-uniformalized is formed on the SBT thin film 66 as shown in FIG. 4D.

Though the initial layer 65 and the final layer 68 are formed as described above, an effect similar to that of the third embodiment is produced.

Although the annealing temperature for forming the initial layer 65 is 600° C. to 700° C. in the fifth embodiment, the annealing temperature may be 550° C. to 700° C. since the tentative baking has preliminarily been performed at a temperature of 450° C.

Although the annealing time for forming the initial layer 65 is 30 minutes, the annealing time may be longer than 10 minutes and not longer than 60 minutes.

Although the annealing temperature for forming the final layer 68 is 800° C., the annealing temperature may be higher than 700° C. and not higher than 800° C.

A semiconductor device fabricating method according to a sixth embodiment of the present invention will be described below.

The semiconductor device fabricating method according to the sixth embodiment differs from the third embodiment only in processes for forming the initial layer 65 and the final layer 68. Therefore, the method for forming the initial layer 65 and the final layer 68 will be described below with reference to FIGS. 4A through 4D. Since the other processes are similar to those of the third embodiment, no description is provided for them.

The initial layer 65 is formed as follows. The SBT solution 64 shown in FIG. 4A is dried and tentatively baked and thereafter annealed in an oxygen atmosphere at a relatively high temperature of 800° C. for 5 to 10 minutes. Through this operation, the initial layer 65 whose crystal grain size is well-uniformalized is formed on the lower electrode 63 as shown in FIG. 4B.

The final layer 68 is formed as follows. The SBT solution 67 shown in FIG. 4C is dried and tentatively baked and thereafter annealed in an oxygen atmosphere at a relatively low temperature of 600° C. to 700° C. for e.g. 30 minutes as the first setting time. Through this operation, the final layer 68 whose crystal grain size is well-uniformalized is formed on the SBT thin film 66 as shown in FIG. 4D.

Though the initial layer 65 and the final layer 68 are formed as described above, an effect similar to that of the third embodiment is produced.

Although the annealing temperature for forming the initial layer 65 is 800° C. in the sixth embodiment, the annealing temperature may be higher than 700° C. and not higher than 800° C.

Although the annealing temperature for forming the final layer 68 is 600° C. to 700° C., the annealing temperature may be 550° C. to 700° C. since the tentative baking has preliminarily been performed at a temperature of 450° C.

Although the annealing time for forming the final layer 68 is 30 minutes, the annealing time may be longer than 10 minutes and not longer than 60 minutes.

Figure 5:
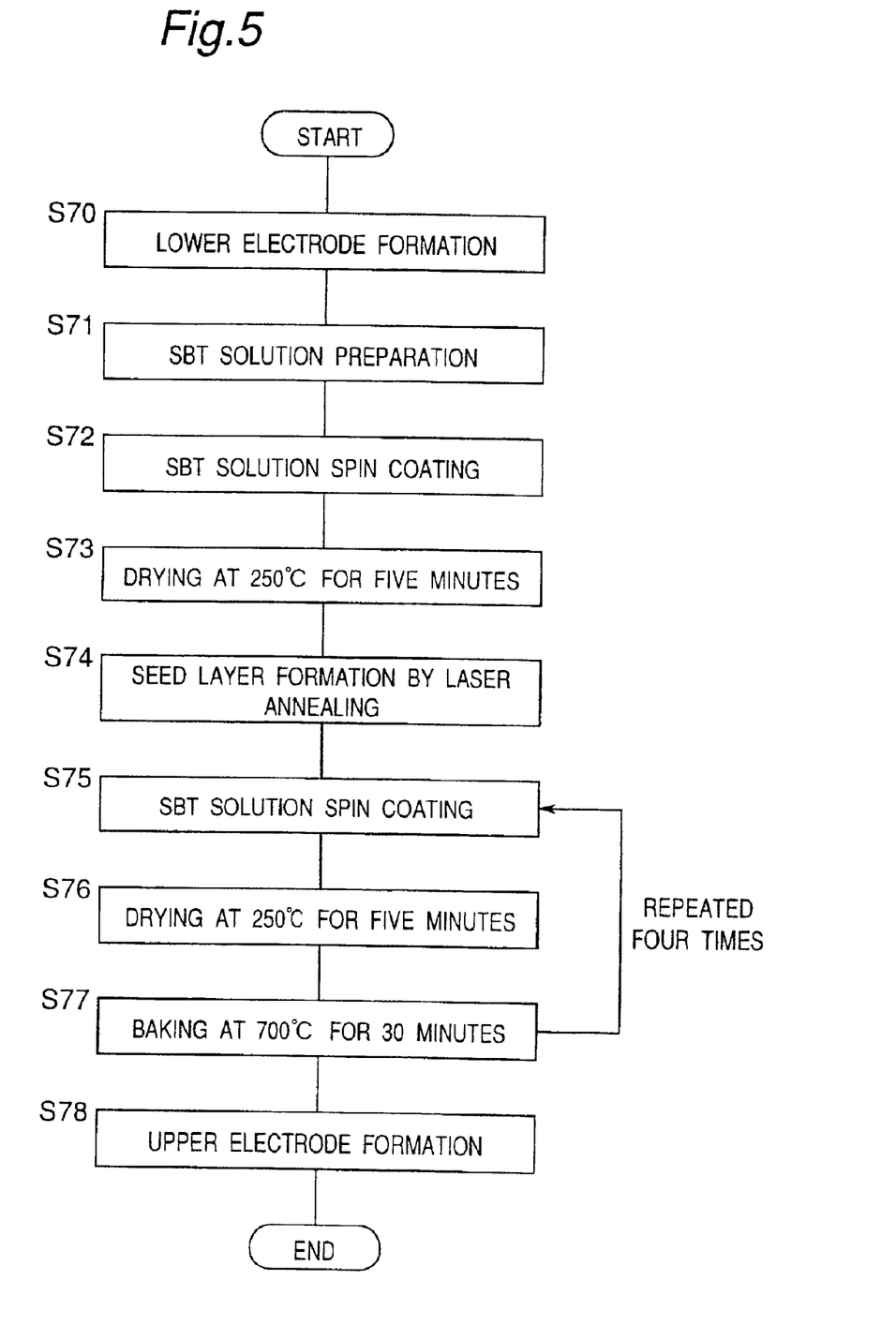
FIG. 5 is a flowchart of a method for fabricating a semiconductor device according to a seventh embodiment of the present invention.
Figure 6A:
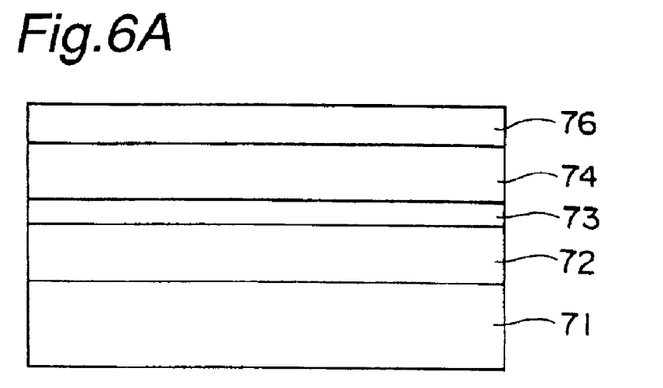
FIGS. 6A and 6B are process charts of the method for fabricating the semiconductor device of the seventh and eighth embodiments of the present invention.
Figure 6B:
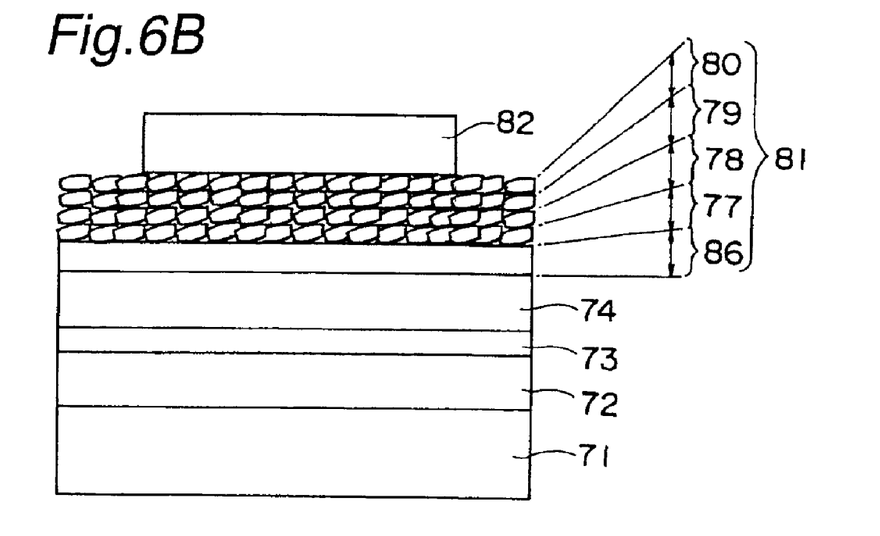

FIG. 5 shows a flowchart of a semiconductor device fabricating method according to a seventh embodiment of the present invention. FIGS. 6A and 6B show process charts of the semiconductor device fabricating method according to the seventh embodiment. According to the semiconductor device fabricating method, a crystallized ferroelectric thin film is obtained.

The semiconductor device fabricating method will be described with reference to FIG. 5 and FIGS. 6A and 6B.

As shown in FIG. 6A, a silicon oxide film 72 is firstly formed by thermal oxidation on a silicon substrate 71. Further, an adhesion layer 73 made of Ti and a lower electrodes 74 made of Pt are successively laminated onto the silicon oxide film 72 by the sputtering method (step S70 in FIG. 5).

Next, an SBT solution to be applied onto the lower electrode 74 is prepared. Specifically, the SBT solution is prepared so that the composition ratio becomes Sr/Bi/Ta= 8/24/20 (step S71 in FIG. 5).

Then, the SBT solution of Sr/Bi/Ta=8/24/20 is spin-coated onto the lower electrode 74 (step S72 in FIG. 5).

Next, drying is performed at a temperature of 250° C. for 5 minutes, and a SBT layer 76, which is before being crystallized, is formed on the lower electrode 74 (step S73 in FIG. 5).

Subsequently, the SBT layer 76 is crystallized by undergoing laser annealing, and a seed layer 86 that serves as the lowermost layer having well-uniformilized crystal grains is formed on the lower electrode 74 as shown in FIG. 6B (step S74 in FIG. 5).

Next, the SBT solution is spin-coated onto the seed layer 86 (step S75 in FIG. 5).

Then, the SBT layer, which is before being crystallized and located on the seed layer 86, is dried at a temperature of 250° C. for 5 minutes (step S76 in FIG. 5).

Next, the dried SBT layer is crystallized by annealing at a temperature of 700° C. for 30 minutes. Through this operation, a crystallized SBT layer 77 is formed on the seed layer 86 (step S77 in FIG. 5).

Subsequently, the SBT layer 78 and the SBT layer 79 are successively laminated onto the SBT layer 77 by repeating the steps S75 through S77 three times, forming a ferroelectric thin film 81 of 200 nm in thickness that is constructed of the seed layer 86 and the SBT layers 77, 78, 79, 80. That is, the steps S75 through S77 are repeated four times in total.

Next, Pt of the upper electrode material is deposited on the SBT layer 80 by sputtering. Then, a resist of the desired shape is formed on the deposited. Pt by photolithography. The deposited Pt is patterned with this resist used as a mask. Through this operation, an upper electrode 82 made of Pt is formed on the ferroelectric thin film 81 (step S78 in FIG. 5).

As described above, the seed layer 86 is crystallized by laser annealing, and therefore, generation of crystalline nucleus precedes crystal growth in the seed layer 86. Consequently, crystal grains in the seed layer 86 is restrained from growing coarsely, the seed layer 86 of a high crystalline nucleus density is obtained. With this arrangement, the surface morphology of the ferroelectric thin film 81 is improved, and the uniformity in the grain size of the ferroelectric thin film 81 is improved. Therefore, the structure of the ferroelectric thin film 81 becomes fine, and this allows the improvement in the electrical characteristic and the ferroelectric characteristic of the ferroelectric capacitor constructed of the lower electrode 74, the ferroelectric thin film 81 and the upper electrode 82.

In the ferroelectric thin film 81, the growth of the coarse crystal grains is restrained. Therefore, the crystal grains become minute, and the crystal grain size becomes uniform. As a result, the homogeneity of the ferroelectric capacitor constructed of the lower electrode 74, the ferroelectric thin film 81 and the upper electrode 82 is improved, and the symmetry of the hysteresis loop is also improved, allowing the remanence to be increased.

The surface morphology of the ferroelectric thin film 81 is improved, and therefore, adhesion of the ferroelectric thin film 81 to the lower electrode 74 and the upper electrode 82 is improved to reduce cracks. This enables a reduction in leakage current occurring between the lower electrode 74 and the upper electrode 82.

The remanence of the ferroelectric capacitor is large, and the leakage current through the ferroelectric capacitor is reduced. Therefore, when the ferroelectric capacitor is used for a storage element, the performance of the storage element can be improved.

The cracks occurring in the ferroelectric capacitor is reduced, and therefore, manufacturing yield can be improved.

Crystallization of the ferroelectric thin film 81 is performed without using any vacuum device. Since no vacuum device is needed, mass-productivity can be further improved than when the vacuum device is used.

Even though the ferroelectric thin film 81 is a Bi layer structure ferroelectric substance that tends to generate coarse crystal grains, it is possible to make the crystal structure of the ferroelectric thin film 81 fine.

Although the SBT solution of the composition ratio of Sr/Bi/Ta=8/24/20 is used in this embodiment, an SBT solution of another composition ratio may be used.

So long as the ferroelectric thin film 81 has ferroelectric characteristic and is crystallized, the ferroelectric thin film 81 is not specifically limited. For example, the ferroelectric thin film 81 may be formed of a material of the following composition:

$$Bi_2A_{m-1}B_mO_{3m+3}$$

where A: one selected from Na, K, Pb, Ca, Sr, Ba and Bi, B: one selected from Fe, Ti, Nb, Ta, W and Mo, and m: natural number.

When $Bi_2A_{m-1}B_mO_{3m+3}$ is used as a material for the ferroelectric thin film, deterioration due to the film fatigue of the ferroelectric thin film can be removed.

Heat treatment of the SBT layers 77, 78, 79 and 80 can be effected by the well-known annealing methods such as laser annealing and rapid thermal annealing by infrared ray heating with an infrared ray lamp.

The heat treatment temperature for forming the seed layer 86 and the SBT layers 77, 78, 79 and 80 is not specifically limited so long as it is a temperature for crystallization.

However, the temperature should preferably be as low as possible. The heat treatment temperature should be not higher than 750° C. or preferably be within a temperature range of 600 to 750° C. or more preferably be within a temperature range of 600 to 700° C. or still more preferably be within a temperature range of 600 to 650° C. Then, the heat treatment time should be arbitrarily set according to the heat treatment temperature. The laser annealing time should be about one second to 60 minutes.

In the seventh embodiment, the silicon substrate 71 is employed as a preferable one. However, it is acceptable to employ a substrate that can be used for a semiconductor device or an integrated circuit. For example, a compound semiconductor substrate of GaAs, an oxide crystal substrate of go or a glass substrate as well as a semiconductor substrate of silicon may be used according to the type and application of a device to be formed.

Although the lower electrode 74 is formed of Pt, material of the lower electrode 74 is not limited to Pt. Any material may be used so long as the material has electrical conductivity and endures in the film forming process of the ferroelectric thin film that is formed on the lower electrode. For example, Ta, Ti, Pt, Pt/Ti, Pt/Ta or the like may be employed as a material for the lower electrode. The film thickness of the lower electrode is also not specifically limited. The film thickness of the lower electrode may be arbitrarily changed according to the size or the like of the element to be formed.

Although the steps S75 through S77 are repeated four times in the above embodiment, those steps may be repeated a plurality of times other than four. In general, the steps S75 through S77 are repeated preferably three to five times.

Figure 7:
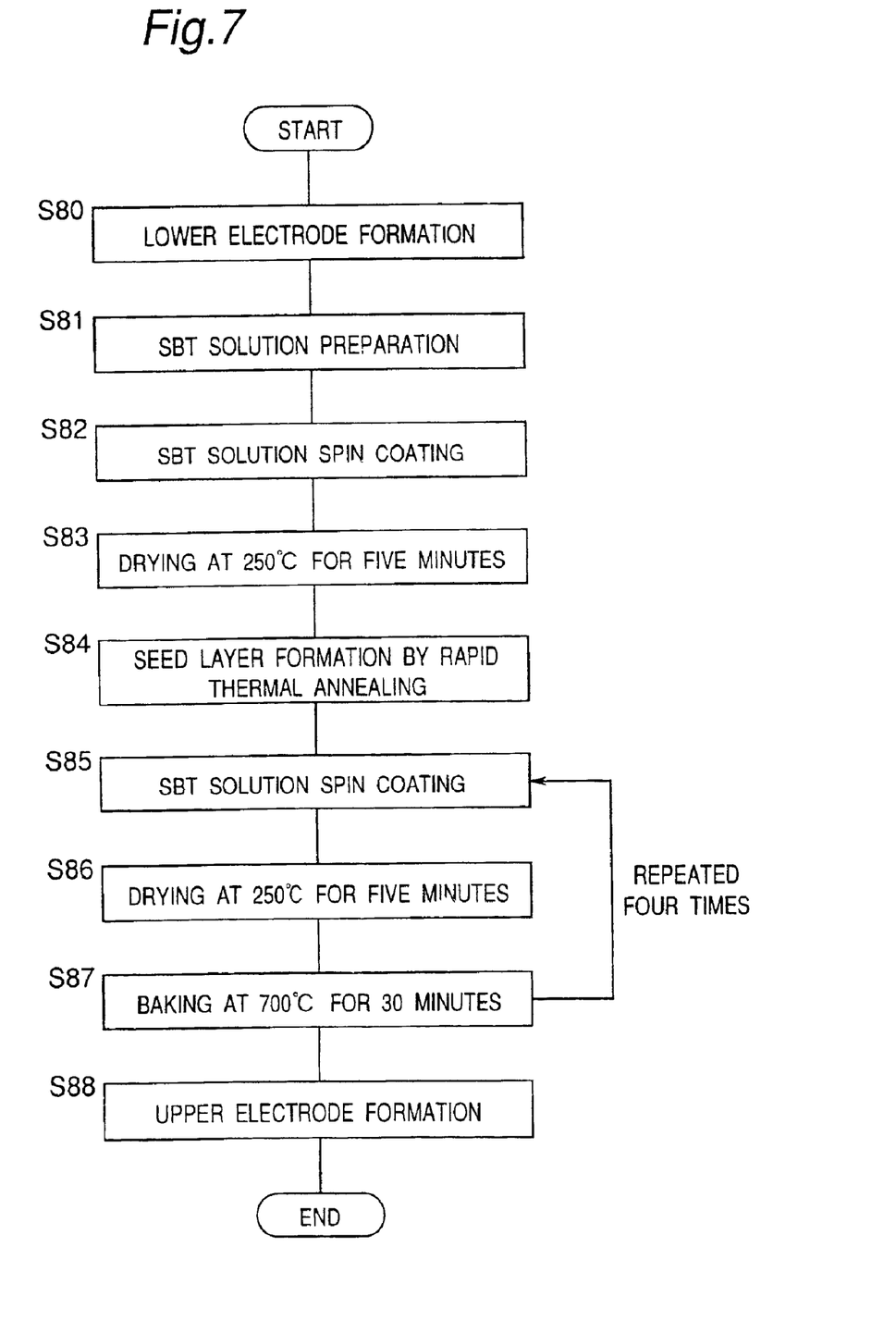
FIG. 7 is a flowchart of the method for fabricating the semiconductor device of the eighth embodiment.

FIG. 7 shows a flowchart of a semiconductor device fabricating method according to an eighth embodiment of the present invention. In the eighth embodiment, a rapid thermal annealing is used in order to obtain the seed layer, though the laser annealing is used in the seventh embodiment.

The semiconductor device fabricating method of the eighth embodiment will be described below with reference to FIGS. 6A and 6B and FIG. 7.

As shown in FIG. 6A, a silicon oxide film 72 is firstly formed on a silicon substrate 71 by thermal oxidation. Further, an adhesion layer 73 made of Ti and a lower electrodes 74 made of Pt are successively laminated onto the silicon oxide film 72 by the sputtering method (step S80 in FIG. 7).

Next, an SBT solution to be applied onto the lower electrode 74 is prepared. Specifically, the SBT solution is prepared so that the composition ratio becomes Sr/Bi/Ta= 8/24/20 (step S81 in FIG. 7).

Then, the SBT solution of Sr/Bi/Ta=8/24/20 is spin-coated onto the lower electrode 74 (step S82 in FIG. 7).

Next, drying is performed at a temperature of 250° C. for five minutes, and the SBT layer 76, which is before being crystallized, is formed on the lower electrode 74 (step S83 in FIG. 7).

Subsequently, the SBT layer 76 is subjected to rapid thermal annealing by infrared ray heating with an infrared ray lamp. The rapid thermal annealing crystallizes the SBT layer 76, so that a seed layer 86 is formed on the lower electrode 74 as shown in FIG. 6B (step S84 in FIG. 7). The seed layer 86 serves as the lowermost layer having well-uniformilized crystal grains.

Next, the SBT solution is spin-coated onto the seed layer 86 (step S85 in FIG. 7).

Then, the SBT layer, which is before being crystallized and located on the seed layer 86, is dried at a temperature of 250° C. for five minutes (step S86 in FIG. 7).

Next, the dried SBT layer is crystallized by annealing at a temperature of 700° C. for 30 minutes. Through this operation, a crystallized SBT layer 77 is formed on the seed layer 86 (step S87 in FIG. 7).

Subsequently, the SBT layer 78 and the SBT layer 79 are successively laminated onto the SBT layer 77 by repeating the steps S85 through S87 three times in order to form a ferroelectric thin film 81 that has a film thickness of 200 nm and is constructed of the seed layer 86 and the SBT layers 77, 78, 79 and 80. That is, the steps S85 through S87 are repeated four times in total.

Next, Pt of the upper electrode material is deposited on the SBT layer 80 by sputtering. Then, a resist of the desired shape is formed on the deposited Pt by photolithography. The deposited Pt is patterned with this resist used as a mask. Through this operation, an upper electrode 82 made of Pt is formed on the ferroelectric thin film 81 (step S88 in FIG. 7).

According to the above-mentioned semiconductor device fabricating method, an effect similar to that of the seventh embodiment is produced. Furthermore, since the seed layer 86 is obtained by thermal rapid annealing, the manufacturing cost can be made lower than when the seed layer 86 is obtained by laser annealing.

Although the seventh embodiment employs the SBT solution of the composition ratio of Sr/Bi/Ta=8/24/20, the present invention is not limited to this, that is, an SBT solution of another composition ratio may be employed.

The invention being thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device having a ferroelectric capacitor comprising:
   a lower electrode laminated on one side to a substrate;
   a ferroelectric thin film constructed of at least three layers including a lowermost layer, an uppermost layer and an intermediate layer located between the lowermost layer and the uppermost layer, said lowermost layer only being directly laminated on another side of said lower electrode; and
   an upper electrode only being directly laminated, on one side, to said uppermost layer, so that said intermediate layer does not directly contact either said lower electrode or said upper electrode, said three layers being formed from crystal grains having a uniform size within each partial layer;
   the lowermost layer being formed of uniform minute crystal grains having small pinhole size gaps therebetween and with a crystalline nucleus density of the lowermost layer being higher than those of the intermediate and uppermost layers.

2. A semiconductor device having a ferroelectric capacitor comprising:
   a lower electrode laminated on one side to a substrate;
   a ferroelectric thin film laminated constructed of five layers including a lowermost layer, an uppermost layer and three intermediate layers located between the lowermost layer and the uppermost layer, said lowermost layer only being directly laminated on another side of said lower electrode; and
   an upper electrode only being directed laminated on one side, to said uppermost layer, so that none of said three intermediate layers directly contact either said lower electrode or said upper electrode, said layers being formed from crystal grains having a uniform size within each particular layer, wherein a crystalline nucleus density of the lowermost layer is higher than those of the uppermost and intermediate layers.

3. A semiconductor device having a ferroelectric capacitor comprising:

a lower electrode laminated on one side to a substrate;

a ferroelectric thin film constructed of at least three layers including a lowermost layer, a uppermost layer and an intermediate layer located between the lowermost layer and the uppermost layer, said lowermost layer only being directly laminated on another side of said lower electrode; and an upper electrode only being directly laminated, on one side, to said uppermost layer, so that said intermediate layer does not directly contact either said lower electrode or said upper electrode, said three layers being formed from crystal grains having a uniform size within each partial layer;

the uppermost layer being formed of uniform minute crystal grains having small pinhole size gaps therebetween and with a crystalline nucleus density of the uppermost layer being higher than those of the intermediate and lowermost layers.

4. A semiconductor device having a ferroelectric capacitor comprising:

a lower electrode laminated on one side to a substrate;

a ferroelectric thin film constructed of five layers including a lowermost layer, an uppermost layer and an three intermediate layers located between the lowermost layer and the uppermost layer, said lowermost layer only being directly laminated on another side of said lower electrode; and an upper electrode only being directly laminated on one side, to said uppermost layer, so that none of said three intermediate layers directly contact either said lower electrode or said upper electrode, said layers being formed from crystal grains having a uniform size within each particular layer, wherein a crystalline nuclear density of the uppermost layer is higher than those of the lowermost and intermediate layers.

5. A semiconductor device having a ferroelectric capacitor comprising:

a lower electrode laminated on one side to a substrate;

a ferroelectric thin film constructed of at least three layers including a lowermost layer, a uppermost layer and an intermediate layer located between the lowermost layer and the uppermost layer, said lowermost layer only being directly laminated on another side of said lower electrode; and an upper electrode only being directly laminated, on one side, to said uppermost layer, so that said intermediate layer does not directly contact either said lower electrode or said upper electrode, said three layers being formed from crystal grains having a uniform size within each partial layer;

the uppermost layer and the lowermost layer being formed of uniform minute crystal grains having small pinhole size gaps therebetween and with crystalline nucleus densities of the uppermost layer and the lowermost layer being higher than that of the intermediate layer.

6. A semiconductor device having a ferroelectric capacitor comprising:

a lower electrode laminated on one side to a substrate;

a ferroelectric thin film constructed of five layers including a lowermost layer, an uppermost layer and an three intermediate layers located between the lowermost layer and the uppermost layer, said lowermost layer only being directly laminated on another side of said lower electrode; and an upper electrode only being directly laminated on one side, to said uppermost layer, so that none of said three intermediate layers directly contact either said lower electrode or said upper electrode, said layers being formed from crystal grains having a uniform size within each particular layer, wherein crystalline nuclear densities of the uppermost layer and the lowermost layer are higher than those of the intermediate layers.

* * * * *